United States Patent [19]

Noguchi et al.

[11] Patent Number: 5,101,376
[45] Date of Patent: Mar. 31, 1992

[54] INTEGRATED MICROPROCESSOR WITH ASSOCIATIVE MEMORY DEVICE

[75] Inventors: Kouki Noguchi, Kokubunji; Mitsuru Akizawa, Hachioji; Kanji Kato, Tokorozawa, all of Japan

[73] Assignees: Hitachi, Ltd.; Hitachi Maxell Ltd., both of Tokyo, Japan

[21] Appl. No.: 690,058

[22] Filed: Apr. 23, 1991

Related U.S. Application Data

[62] Division of Ser. No. 550,156, Jul. 9, 1990, Pat. No. 5,036,486.

[30] Foreign Application Priority Data

Jul. 31, 1989 [JP] Japan .................. 1-196564

[51] Int. Cl.$^5$ .............................................. B11C 15/04
[52] U.S. Cl. ............................ 364/925.6; 364/947.2; 364/956; 364/965.9; 365/49; 365/189.07; 357/40
[58] Field of Search ............... 365/49, 189.07; 364/956, 947.2, 965.9, 925.6; 395/400, 425; 357/40

[56] References Cited

U.S. PATENT DOCUMENTS

| | | | |
|---|---|---|---|
| 4,439,840 | 3/1984 | Coleman et al. | 364/900 |
| 4,622,653 | 11/1986 | McElroy | 365/49 |
| 4,890,260 | 12/1989 | Chuang et al. | 365/49 |
| 4,897,814 | 1/1990 | Clark | 365/189.07 |

FOREIGN PATENT DOCUMENTS 58-146089 5/1983 Japan .
59-220838 12/1984 Japan .

OTHER PUBLICATIONS

Am99C10 (AMD Corp.) Catalog, Nov. 16, 1988, pp. 1-30.

*Primary Examiner*—Joseph E. Clawson, Jr.
*Attorney, Agent, or Firm*—Fay, Sharpe, Beall, Fagan, Minnich & McKee

[57] ABSTRACT

In associative memory device, a search key is stored in the first storage element and a storage key is stored in the second storage elements, respectively via a first data bus. The search key is supplied to the comparator via a second data bus, and the storage key stored in the second storage element is supplied to the comparator. The comparator compares the search key with the storage key. When the storage key is consistent with the search key, the comparator delivers as the associative operation results a comparison consistency output signal to a priority encoder circuit which outputs code information having a limited bit length. This code information is transferred to CPU via a selector circuit. If the comparator delivers a comparison inconsistency output signal, this signal is directly passed to CPU via the priority encoder circuit, so that the contents of the first storage element is rewritten. The first and second storage elements are designated by an address signal and data is read or written via the first data bus, so that they are used as a usual memory device.

4 Claims, 11 Drawing Sheets

CONSISTENCY / INCONSISTENCY CIRCUIT

INTEGRATED MICROPROCESSOR WITH ASSOCIATIVE MEMORY DEVICE

This application is a divisional application of U.S. Ser. No. 550,156, filed July 9, 1990 now U.S. Pat. No. 5,036,486.

BACKGROUND OF THE INVENTION

The present invention relates to an associative memory device, and more particularly to an associative memory device capable of being used as a usual memory device and executing a search processing for text data at high speed.

In a conventional associative memory device, as described in a catalog of Am99C10 (AMD CORP.), storage keys as a comparison reference are previously set in the device, and upon entry of a search key as a comparison object, the associative operation results are outputted after a lapse of certain time. In addition to a device of the type that a priority encoder and the like are used to output predetermined code information, there is known a device of the type that code information set as desired is outputted as described in Japanese Patent Laid-open Publications JP-A-58-146089 and JP-A-59-220838. These associative devices have been used as dedicated devices for speeding up pattern matching processing and address translation processing.

SUMMARY OF THE INVENTION

Such conventional associative memory devices having nothing but an associative memory function so that the use efficiency is poor if they are built in a general module such as a single chip microcomputer. Namely, consider the interconnection between CPU and a built-in associative memory device as a general module, the associative memory device cannot be accessed by using only address and data busses unless a new bus and its control circuit are additionally provided. Accordingly, it is difficult to use it as a general module for an Application Specification Integrated Circuit (ASIC) of CPU core type, and the chip area will increase.

It is an object of the present invention to provide an associative memory device capable of serving as both an associative memory and a usual memory to thereby broaden an application field of the associative memory device as a general module.

It is another object of the present invention to provide a microcomputer incorporated with an associative memory device which can be easily coupled to CPU only by using an address bus and data bus.

According to an aspect of the associative memory device of the first invention, the associative memory device comprises a first storage element (1) for storing data of a predetermined bit length; a plurality of second storage elements (2) for storing data of the predetermined bit length; a first data bus (5) connecting to the first storage element (1) and the plurality of second storage elements (2) so as to read and write the data of the predetermined bit length; a second data bus (6) transferring the data of the predetermined bit length stored in the first storage element (1); a plurality of comparators (7) coupled to the second storage elements (2) and the second data bus (6) for comparing the data of the predetermined bit length stored in the first storage element (1) with the data of the predetermined bit length stored in the plurality of second storage element (2); an output section (10) connected to said plurality of comparators (7) to receive the comparison results outputted from the plurality of comparators (7); and a selector section (12) having first terminal (A1), second terminal (A2) and third terminal (A3), the first terminal being connected to the first data bus (5), the second terminal being connected to an output line (11a) of the output section (10), and the third terminal (A3) being connected to a data signal line (13a) for inputting and outputting signals, the selector section responsive to a predetermined state of a control signal for allowing a signal transmission between the first terminal (A1) and third terminal (A3) and inhibiting a signal transmission between the second terminal (A2) and third terminal (A3), and responsive to a state of the control signal different from the predetermined state for inhibiting a signal transmission between the first terminal (A1) and third terminal (A3) and allowing a signal transmission between the second terminal (A2) and third terminal (A3).

The data of the predetermined bit length are stored in the first storage element (1) and the plurality of second storage elements (2) via the third terminal (A3) and first terminal (A1) of the selector section (12) and via the first data bus (5). The associative memory device includes an address decoder (4, 4a) responsive to an address signal (3) for selecting at least one of the first storage element (1) and the plurality of second storage elements (2), and responsive to a specific value of the address signal (3) for supplying the control signal to the selector section (12) so that code information (11) from the output section (10) is transmitted from the second terminal (A2) to third terminal (A3) of the selector section (12).

In the above manner, the first storage element (1) and each of the second storage elements (2) are designated by an address signal (3) and the data of a predetermined bit length are read and written via the first data bus (5) relative to the first storage element (1) and second storage elements (2). Accordingly the storage elements (1) and (2) can be used as a usual memory device.

The associative operation is carried out through comparison by a comparator (7) between a search key stored in the first storage element (1) and a storage key stored in the second storage element (2). The associative operation firstly starts writing the data of a predetermined bit length in the first storage element (1) and second storage elements (2) via the first data bus (5).

The associative operation results are represented by code information (11) obtained from the output section (10) via the second terminal (A2) when as described previously, the selector section (12) which uses the comparison results by the comparators (7) inhibits a signal transmission between the first terminal (A1) and third terminal (A3) and allows a signal transmission between the second terminal (A2) and third terminal (A3). The selector section (12) can select a signal for designating any of the plurality of second storage elements (2). If this signal is used as a read signal for reading the data of the predetermined bit length, the data can be read from the designated second storage element (2). The data of the predetermined bit length stored in the second storage element (2) remains unchanged unless the data stored in the first storage element (1) is changed. The code information (11) can be outputted to another data bus via the third terminal (A3). Accordingly, reading of the code information (11) is executed during another operation cycle different from the start-up of the associative operation.

According to an aspect of the microcomputer of the second invention, the associative memory device (87) of the first invention is built in the microcomputer so that reading of the code information (11) representative of the associative operation results can be executed even if there occurs no consistency between bit patterns after the end of the associative operation executed in accordance with the comparison results by the comparators (7). Accordingly, even if the associative memory device (87) is connected to CPU (88) by using only the address bus (97) and data bus (96), pattern matching processing and the like can be executed by CPU (88).

DESCRIPTION OF THE PREFERRED EMBODIMENTS

The embodiments of this invention will be described with reference to the accompanying drawings.

Figure 1:
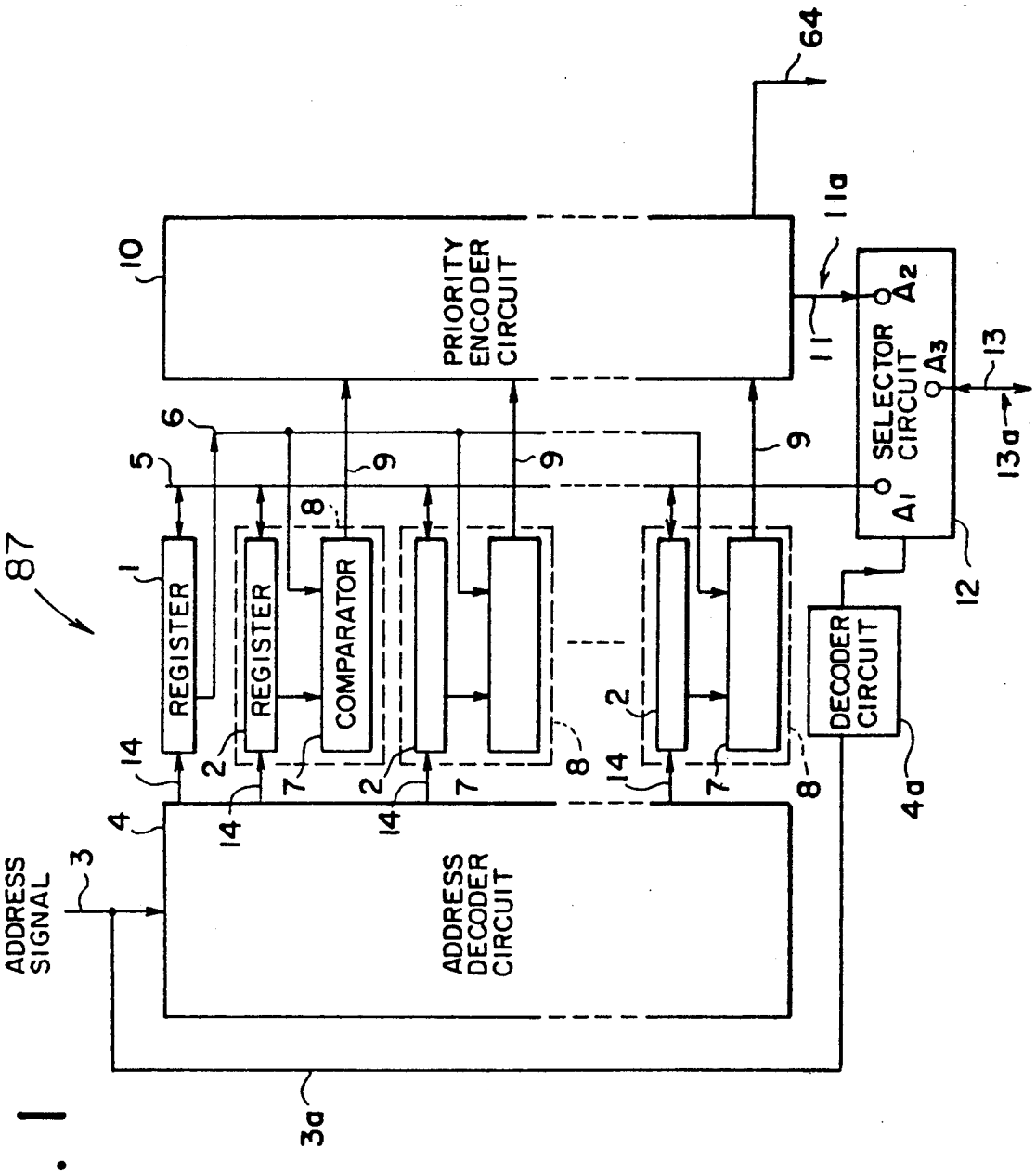
FIG. 1 shows the overall structure of the associative memory device according to an embodiment of this invention.

FIG. 1 shows an associative memory module according to a first invention. This associative memory module 87 is constructed of an address decoder circuit 4, a register 1, a plurality of registers 2, a plurality of comparators 7 pairing the plurality of registers 2, a priority encoder circuit 10, a decoder circuit 4a, and a selector circuit 12. The address decoder circuit 4 receives an address signal 3 and decodes it. Decoded output signals 14 are received by the registers 1 and 2. As will be later described more in detail, the priority encoder circuit 10 receives output signals 9 representative of the comparison results obtained from the comparator 7 in comparison with the contents of the registers 1 and 2. The decoder circuit 4a connected to an address line 3a decodes the address signal 3. The selector circuit 12 is connected to the decoder circuit 4a and to the priority encoder circuit 10 which serves as the output circuit of the associative memory module 87. A combination of registers 2 and comparators 7 constitute an associative memory 8.

The registers 1 and 2 are connected to a first data bus 5, one end of which is connected to a first terminal A1 of the selector circuit 12 to read or write data of a predetermined bit length with respect to the registers 1 and 2. The register 1 is further connected to a second data bus 6 which is connected to the comparators 7 to supply the data of the predetermined bit length stored in the register 1 to respective comparators 7. A signal line 11a extends from the priority encoder circuit 10 to a second terminal A2 of the selector circuit 12. The priority encoder circuit 10 encodes output signals 9 representative of the comparison results obtained from the comparator 7 in comparison with the contents of the registers 1 and 2, and outputs code information 11 having a bit length equal to or shorter than that of the first data bus 5 to the signal line 11a. The selector circuit 12 has a third terminal A3 from which a data signal line 13a is connected. A data signal 13 transferred via the data signal line 13a is a signal including a search key to be stored in the register 1 and a storage key to be stored in registers 2. A consistency/inconsistency signal 64 which is outputted from the priority encoder circuit 10 is a signal for discriminating if all the comparison results by the comparators 7 are consistent or not, in accordance with the output signals 9 representative of the comparison results between the contents of the registers 1 and 2.

In the above manner, as an address signal 3 is supplied to the address decoder circuit 4, this circuit 4 selects at least one of a plurality of output signals 14 to designate at least one of the plurality of registers 2. At this time, a storage key is supplied via the data signal line 13a and selector circuit 12 to the first data bus 5, and to the register or registers designated by the address signal 3.

In operation of the selector circuit 12 and decoder circuit 4a, unless the selector circuit 12 controls to select the code information 11 outputted in accordance with the associative operation by the priority encoder circuit 10 via the second terminal A2, it controls the decoder circuit 4a to select the first data bus 5 via the first terminal A1 in accordance with an address signal 3. In other words, prior to the associative operation of outputting the code information 11 by the priority encoder circuit 10, the search and storage keys are stored in the registers 1 and 2. When an address is supplied as an address signal 3 to the decoder circuit 4a, an output of the decoder circuit 4a controls the selector circuit 12, so that the data transfer between the data signal line 13a and first data bus 5 is enabled.

Figure 12:
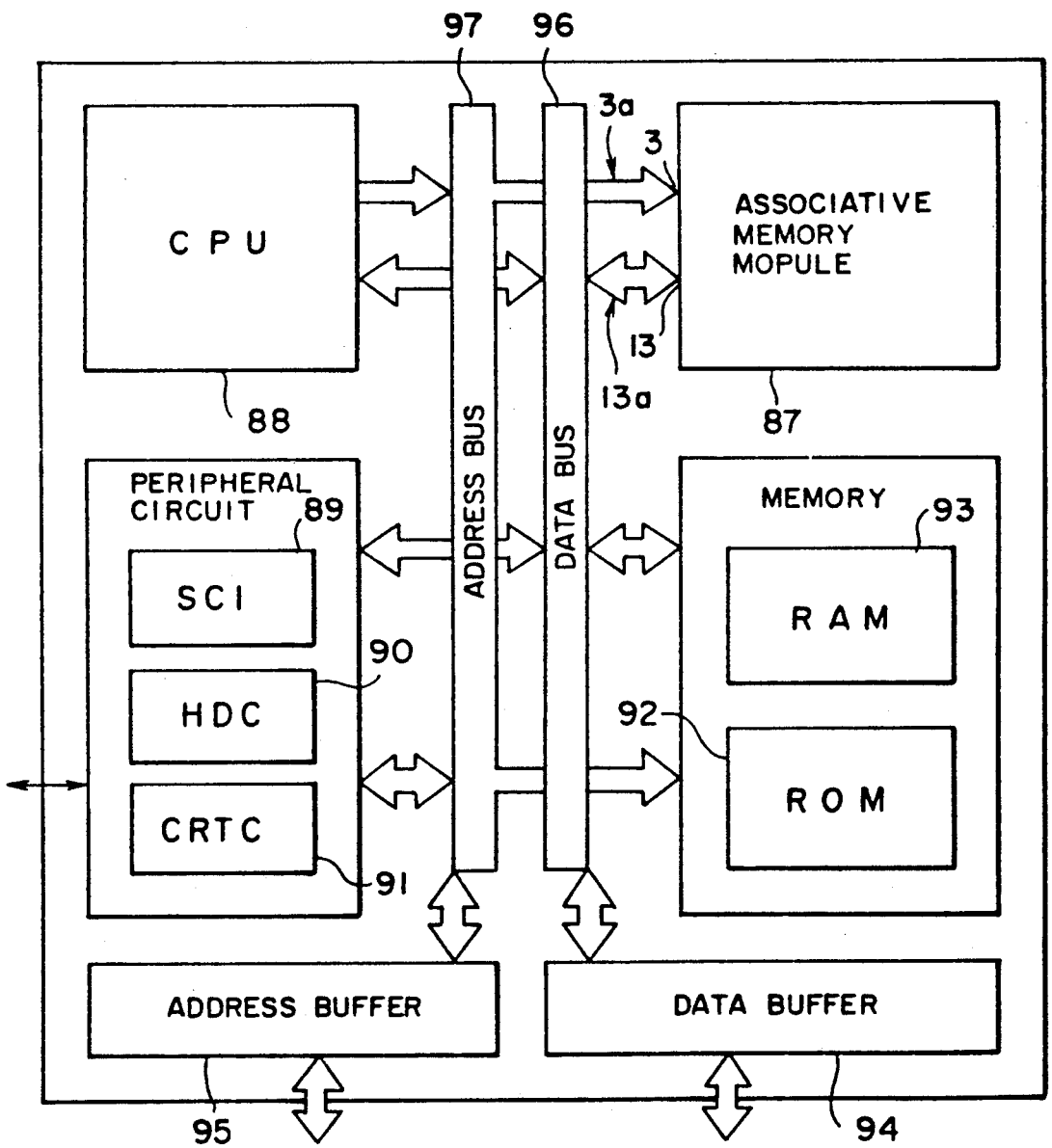
FIGS. 12 to 14 show the configuration of microcomputers mounted with associative memory devices.

The data signal line 13a shown in FIG. 1 is the same data signal line 13a of a single chip microcomputer according to a second invention shown in FIG. 12. This will be described later in more detail. The line interconnecting CPU 88, associative memory module 87, ROM 92, RAM 93, and other necessary circuits is a data bus 96 of this microcomputer. The data signal line 13a interconnects this data bus 96 and associative memory module 87. The data bus 96, and the data signal line 13a and first data bus 5 shown in FIG. 1, are connected together via the third and first terminals A3 and A1 of the selector circuit 12. In this manner, the first data bus 5 and data bus 96 (data signal line 13a) are not directly connected. Similarly, the second data bus 6 in the associative memory module 87 shown in FIG. 1 is not directly connected to the data bus 96 shown in FIG. 12.

In response to the output signals from the address decoder 4, data is written or read with respect to the registers 1 and 2 via the third and first terminals A3 and A1 of the selector circuit 12 and via the first data bus 5. A storage key is written in the registers designated by the address decoder circuit 4. A search key having the same bit length as that of the storage key and supplied from the data signal line 13a is written in the first register 1 via the third and first terminals A3 and A1 of the selector circuit 12 and via the first data bus 5. Thereafter, the search key in the register 1 is read out to the second data bus 6 and supplied to a plurality of comparators 7. In the meantime, the storage key stored in each register 2 is supplied to the corresponding comparator 7 which compares the search and storage keys. If one or more comparators 7 judge the contents of the search and storage keys as consistent, then the comparison results are considered next. The output signal or signals 9 representative of the consistent comparison results are supplied to the priority circuit 10 which in turn outputs the code information 11 having a limited bit length to the signal line 11a.

It is necessary to transfer the outputted code information 11 to the data bus shown in FIG. 12. This transfer operation is realized by allowing the data transfer between the second and third terminals A2 and A3 of the selector circuit 12, and hence allowing the transfer of the code information 11 between the signal line 11a and data signal line 13a.

For the case where a plurality of comparators 7 deliver a plurality of output signals of consistent comparison results, the priority encoder circuit 10 has a function to output the code information 11 by selecting a single output signal 9 corresponding to, e.g., the lowest address. If all the output signals 9 from comparators 7 indicate the inconsistent comparison results, it is necessary to be rewritten the contents of the register 1 storing the present search key. In this case, the consistency/inconsistency signal 64 from the priority encoder circuit 10 is directly transferred to CPU 88 shown in FIG. 13 or 14, so that CPU 88 can execute a rewrite operation for the register 1 at once.

FIGS. 2 to 11 are detailed circuit diagrams of the associative memory 8 constructed of a register 2 and comparator 7.

Figure 2:
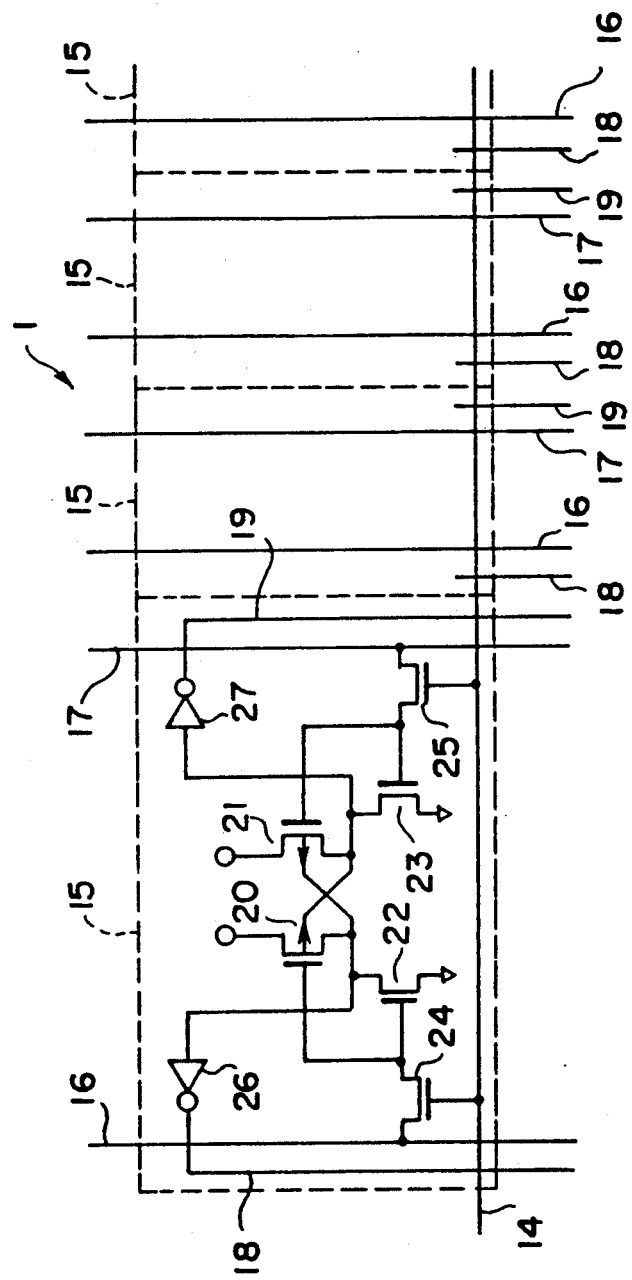
FIG. 2 is a circuit diagram of a first storage element for storing a search key.

FIG. 2 shows the circuit arrangement of the register 1. Each circuit section 15 represents one bit of the register 1. The first data bus 5 shown in FIG. 1 is constructed of positive and negative polarity signal lines 16 and 17. The second data bus 6 is constructed of similar signal lines 18 and 19. The register 1 is constructed of two p-channel MOSs 20 and 21, and four n-channel MOSs 22, 23, 24, and 25. This configuration is the same as a static RAM memory cell. The register 1 can perform data input/output via the signal lines 16 and 17 in response to the output signal 14 from the address decoder circuit 4. The information stored in this memory cell is outputted via drivers 26 and 27 to the signal lines 18 and 19.

Figure 3:
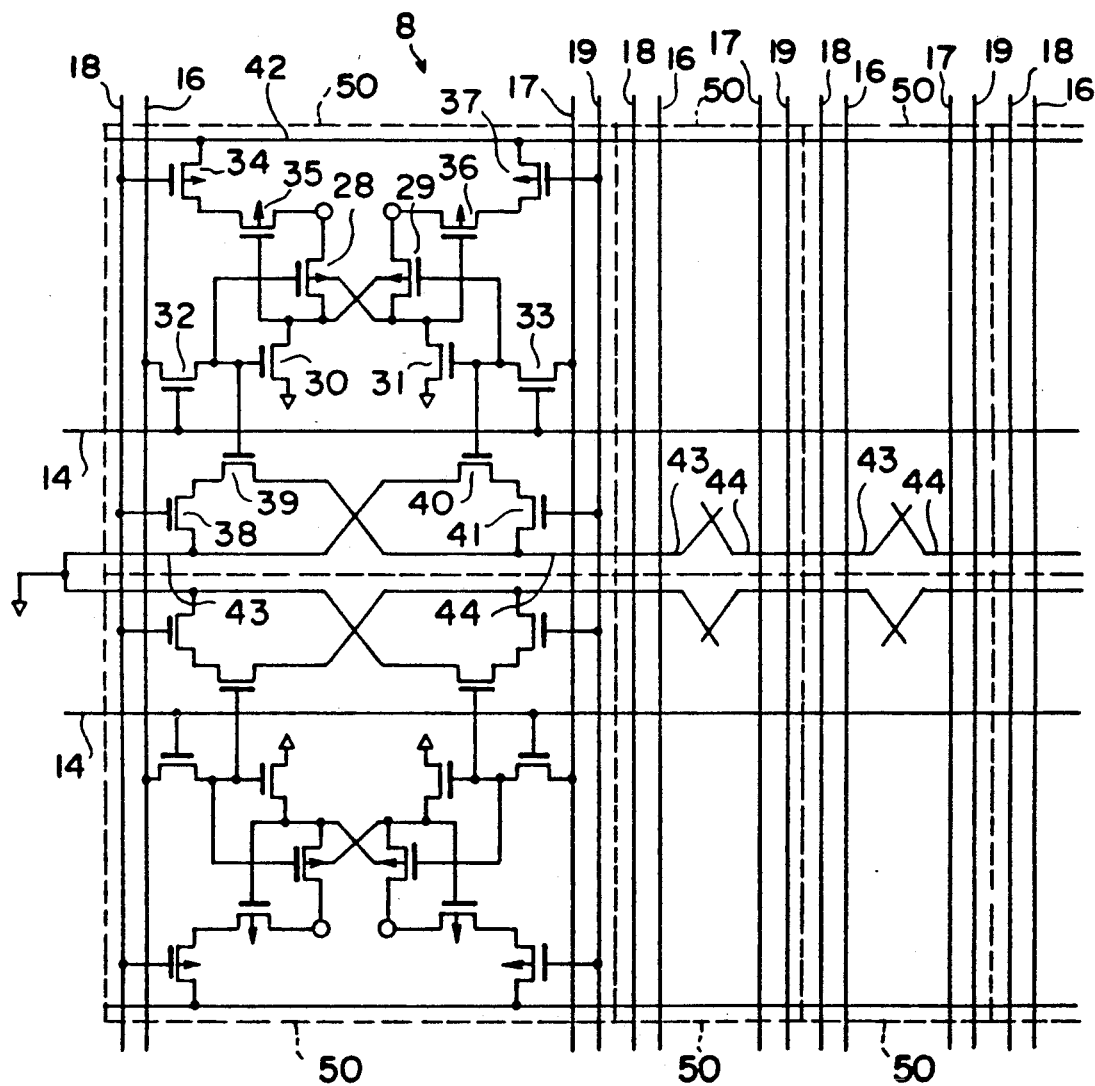
FIG. 3 is a circuit diagram of an associative memory cell.

FIG. 3 shows the structure of an associative memory cell 50 corresponding to one bit of the associative memory 8 constructed of a register 2 and comparator 7. Similar to the structure of the register 1 shown in FIG. 2, the register 2 is constructed of two p-channel MOSs 28 and 29, and four n-channel MOSs 30, 31, 32 and 33. Data input/output relative to the signal lines 16 and 17 is controlled by the output signal 14 from the address decoder 4. The comparator 7 is constructed of four p-channel MOSs 34, 35, 36, and 37, and four n-channel MOSs 38, 39, 40, and 41. If the value on the signal lines 18 and 19 outputted from the register 1 is equal to the value of the register 2, one of p-channel MOSs 34 and 35 or one of p-channel MOSs 36 and 37 turns off so that an output line 42 takes a floating state, whereas both of n-channel MOSs 38 and 39 or both of n-channel MOSs 40 and 41 turn on so that output lines 43 and 44 take an ON state. On the other hand, if the value stored in the register 1 is not equal to the value stored in the register 2, a supply voltage level (H level) is outputted to the output line 42, whereas the output lines take an OFF state. The associative memory 8 constructed of a register 2 and comparator 7 is constructed of associative memory cells 50 disposed in the horizontal direction as shown in FIG. 3. The output line 43 of the associative memory cell 50 at one end of a cell row constituting the associative memory 8 is connected to a ground level (L level), whereas at the other end of a cell row the output line 42 is connected to the output line 44. With such an arrangement, if the value stored in the register 1 is equal to the value stored in the register 2, an L level is inputted to a driver 45, and if not, an H level is inputted to the driver 45. Since the driver 45 is constructed of an inverter, an output signal 9 from the comparator 7 takes an H level if the values of the registers 1 and 2 are equal, and takes an L level if not.

The layout design of associative memory cells 50 such as shown in FIG. 3 reduces the separation area between n- and p-channel MOS regions, and hence the layout area.

Figure 4:
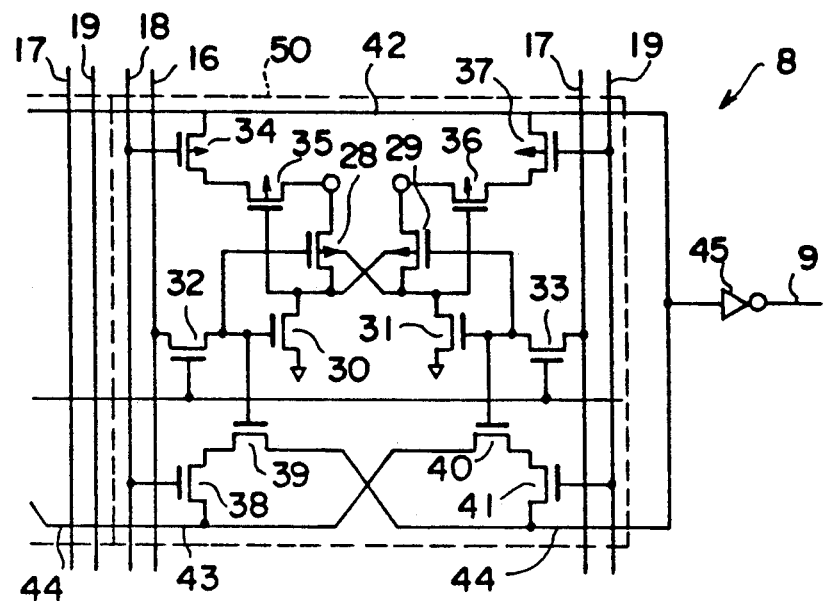
FIG. 4 is a logical circuit for outputting the comparison results made by an associative memory.
Figure 5:
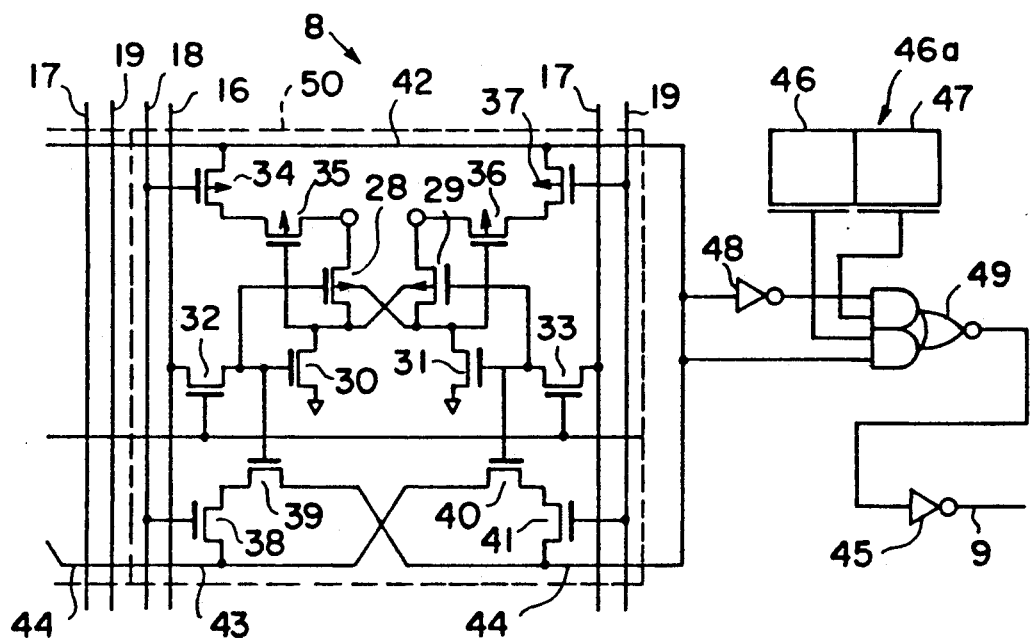
FIG. 5 is another logical circuit for outputting the comparison results made by an associative memory.

FIG. 5 shows another example of the structure shown in FIG. 4. Each associative memory 8 is provided with a control register 46a for setting two bit control information 46 and 47. If the values of the control information 46 and 47 of the control register 46a are set as (0, 0), the output signal 9 from the comparator 7 always takes an L level by means of a logical circuit made of an inverter 48 and composite gate 49. Accordingly, there is realized a function not to use the value stored in the register 2 as the comparison object. If the values of the control information 46 and 47 are set as (0, 1), there is realized the associative memory cell 50 equivalent to the circuit shown in FIG. 4, so that an H level is outputted if the values of both the registers 1 and 2 are equal, and an L level if not. On the contrary, if the values of the control information 46 and 47 are set as (1, 0), an L level is outputted if equal, and an H level if not. With such functions, it becomes possible to set the conditions for discriminating control information other than a predetermined pattern matching, i.e., to set the conditions for selective use of a particular function of the associative memory. If the values of the control information 46 and 47 are set as (1, 1), the output signal from the comparator 7 always takes an H level so that "don't care" conditions can be used. The control register 46a storing the control information 46 and 47 may be controlled by using the output signal 14 from the address decoder circuit 4 from which the signal also controls the register 2. The control information 46 and 47 may be set via the first data bus 5 or may be generated from an internal logical circuit operating upon reception of the address signal 3.

Figure 6:
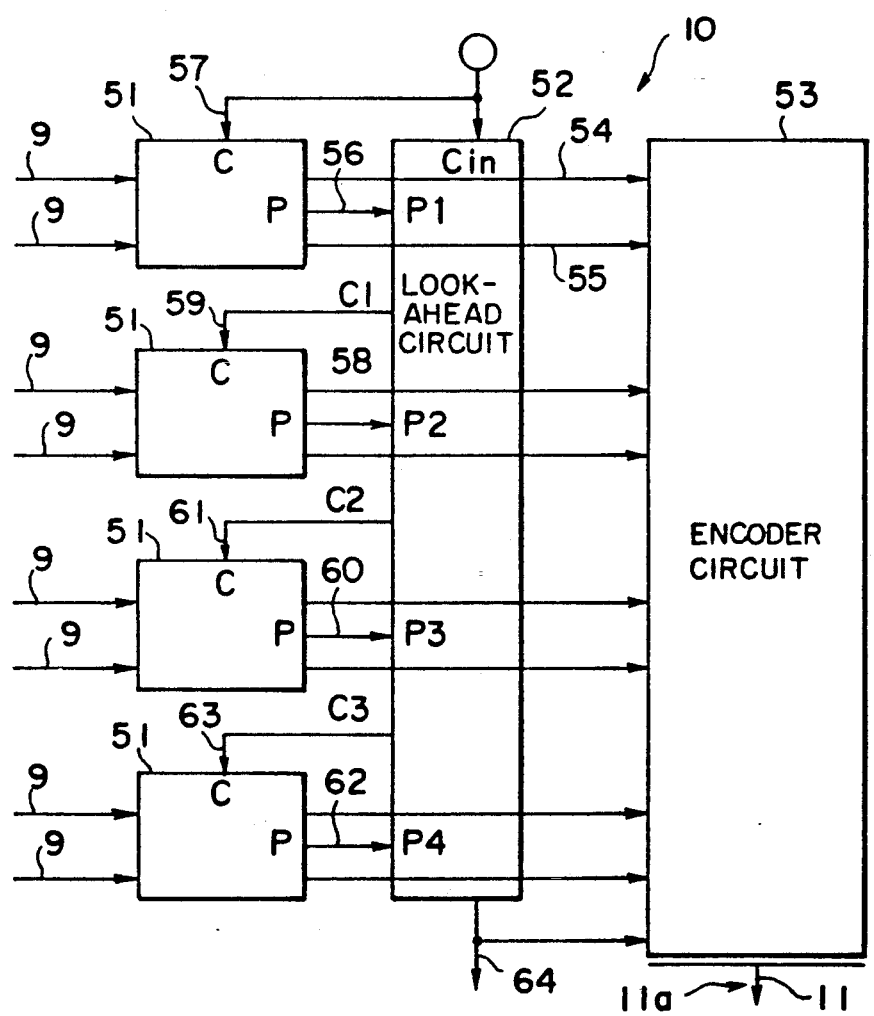
FIG. 6 shows the structure of an output section.

FIG. 6 shows the internal structure of the priority encoder circuit 10 shown in FIG. 1. Logical circuits 51 and 52 detect the output signal 9 located at the highest position as viewed in FIG. 6 among output signals 9 having an H level outputted from the associative memory 8 shown in FIG. 1. The logical circuits 51 and 52 are circulated with a check signal from a signal line 57, and constitute a first-find-1 (H level) circuit which provides an H level as the value of output signal 54 or 55 of a logical circuit 51 by which circuit the output signal 9 having an H level was first found. An encoder circuit 53 outputs to the signal line 11a, the code information 11 set in correspondence with the logical circuit 51 having the H level output signal 54 or 55. If all output signals 9 take an L level, the consistency/inconsistency signal 64 takes an H level. In this case, the encoder circuit 53 outputs the corresponding information code 11 to the signal line 11a.

Figure 7:
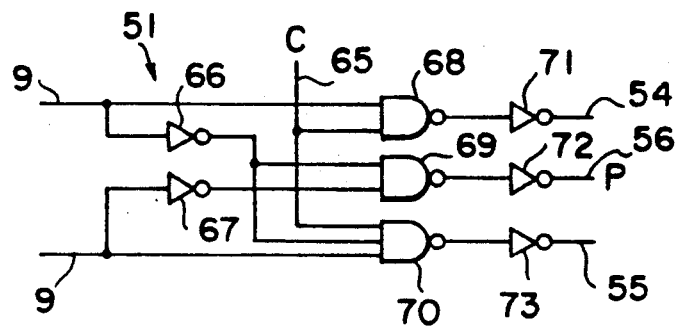
FIG. 7 is a logical circuit for processing comparison result output signals from the associative memory on the two word unit basis.

The structure common to all logical circuits 51 is shown in FIG. 7. When the check signal 65 (common to logical circuits 57, 59, 61, and 63 shown in FIG. 6) of an H level is being circulated, and if the output signal 9 of the associative memory 8 takes an H level, the output signal 54 or 55 of an H level is outputted by means of inverters 66, 71, and 73, and NAND gates 68 and 70. If the output signal 9 takes an L level, the output signal 54 or 55 of an L level is outputted. On the other hand, when the check signal 65 of an L level is being circulate, the output signals 54 and 55 take an L level irrespective of the level of the output signal 9 of the associative memory 8. A logical circuit constructed of inverters 66, 67, and 72 and NAND gate 69 generates a control signal 56 (corresponding to each of other control signals 58, 60, and 62) which is used for speeding up the circulation of the check signal 65. Specifically, if both output signals 9 of an L level are supplied from the associative memories 8 to the logical circuit 51, and the check signal 65 takes an H level, it becomes necessary to circulate at once the H level check signal to the other logical circuit 51 serially connected next to the first-mentioned logical circuit, and to execute the next check operation.

Figure 8:
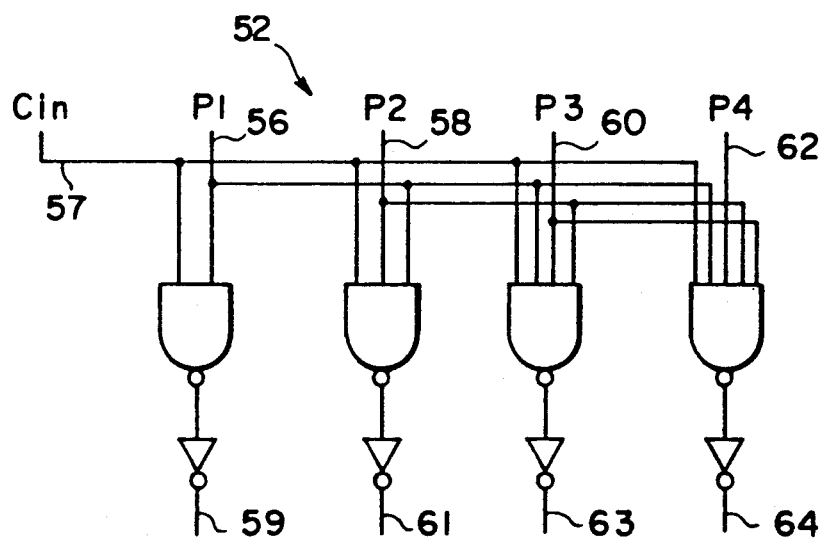
FIG. 8 is a logical look-ahead circuit for processing comparison result output signals at high speed.

FIG. 8 shows the detailed logics of the look-ahead logical circuit 52 (FIG. 6) for executing the circulation of the check signal 65 at high speed. By using the check signal circulation control signals 56, 58, 60, and 62 outputted from the four logical circuits 51 shown in FIG. 7, the check signals 59, 61, and 63 (corresponding to the signal 65 shown in FIG. 7) are supplied to the corresponding logical circuits 51. Signal $C_{in}$ indicative of the check start point is fixed at the supply voltage level (H level). The operation principle of this look-ahead logical circuit 52 is the same as that of a carry look-ahead of an adder. The consistency/inconsistency signal 64 is generated as one of the output signals of the look-ahead logical circuit 52, the signal 64 taking an H level if all output signals 9 from the comparators 7 shown in FIG. 1 takes an L level, i.e., if all values in the registers 2 do not coincide with the set value in the register 1. The consistency/inconsistency signal 64 is outputted to the external circuit of the functional module of this invention, and is also used for obtaining the data signal 13 for another set value of the register 1.

Figure 9:
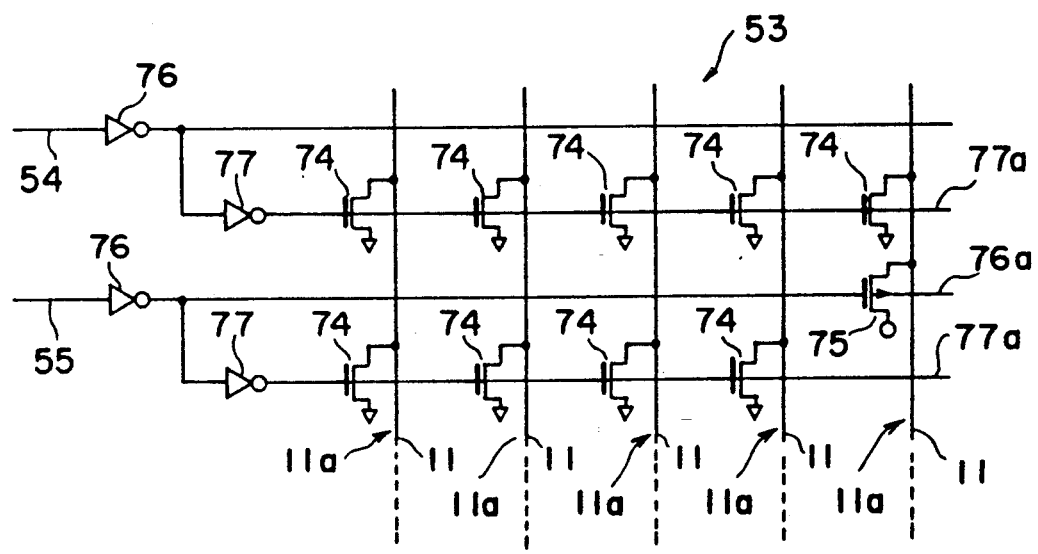
FIG. 9 is a logical encoder circuit.

FIG. 9 is a circuit diagram showing the logical structure of an encoder circuit 53 of the priority encoder circuit 10. Generally, at least one of the output signals 54 and 55 from the logical circuit 51 and the consistency/inconsistency signal 64 from the look-ahead logical circuit 52 takes an H level, and the remaining signals take an L level. These signals are inputted to inverters 76 of the encoder circuit 53. If an H level is inputted to the inverter 76, it outputs an L level and a corresponding inverter 77 outputs an H level. These inputted signals are encoded to output the code information 11 to the signal line 11a for identifying an inverter 76 to which an H level signal has been inputted. If the bit "0" (L level) is to be set in the code information, an n-channel MOS transistor 74 is disposed at the intersection between the bit signal line 11a for the code information 11 and the output line 77a of the inverter 77, whereas if the bit "1" (H level) is to be set in the code information, a p-channel MOS transistor 75 is disposed at the intersection between the bit signal line 11a and the output line 76a of the inverter 76. If an H level is applied as an input signal 54 or 55 to the inverter 76, all n- and p-channel MOS transistors 74 and 75 connected thereto will turn on so that the preset code information is outputted to the signal line 11a. On the other hand, if an H level is applied as an input signal 54 or 55 to the inverter 76, all n- and p-channel MOS transistors 74 and 75 will turn off so that the signal line 11a takes a floating state. Since only one signal of input signals 54 and 55 to the inverters 76 is an H level signal and the other input signals 54 and 55 are an L level, the code information 11 can be outputted without allowing a thru-current to flow.

In the associative memory module 87 of the embodiment shown in FIG. 1, the registers 1 and 2 can be used as a usual memory devices, because the registers are addressed by output signals 14 from the address decoder circuit 4 and data can be read and written with respect to the registers from and to the first data bus 5. In executing the associative function, first the storage key serving as the comparison reference is set in the register 2 in the similar manner as a usual memory write operation. Thereafter, the search key serving as the comparison object is set in the register 1 in the similar manner as a usual memory write operation. The consistency/inconsistency signal 64 is outputted after a lapse of a certain time period. The code information 11 which is the associative operation results can be read in the similar manner as a usual memory read operation.

Figure 10:
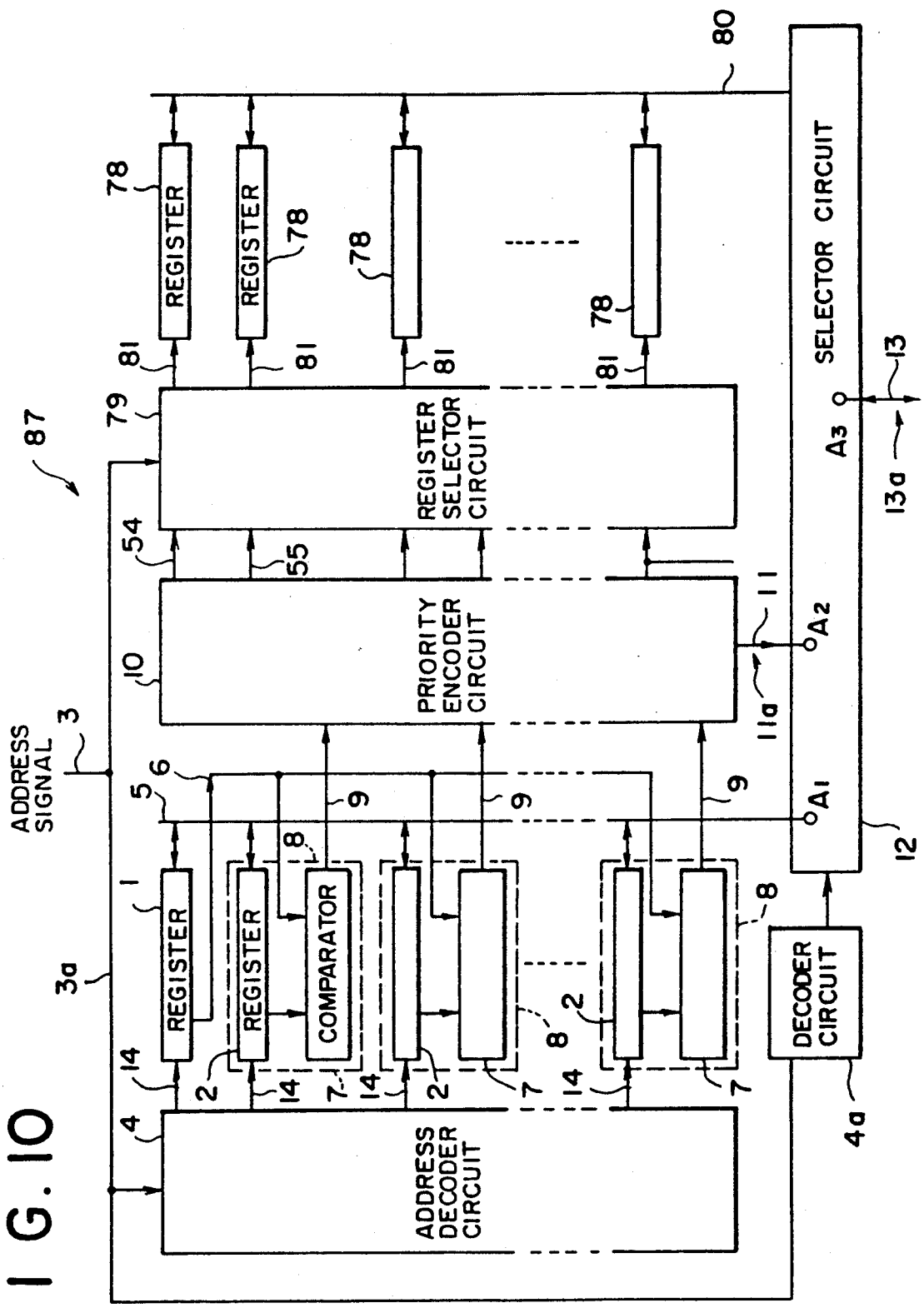
FIG. 10 shows the overall structure of the associative memory device according to another embodiment of this invention.

FIG. 10 shows the structure of the associative memory module according to another embodiment of this invention. The code information 11 representative of the associative operation results of the embodiment shown in FIG. 1 uses a fixedly set bit pattern, whereas this embodiment is constructed such that code information 11 can be set as desired in accordance with the associative operation results. This embodiment has the structure that a register selector circuit 79 and registers 78 are added to the FIG. 1 embodiment. The registers store therein desired code information 11 which is selected by the associative operation results. Since each register 78 can be accessed by the address signal 3, it can be used as a usual memory similar to the registers 1 and 2. The data signal 13 is inputted to or outputted from the registers 78 via the selector circuit 12 by using an internal data bus 80.

Figure 11:
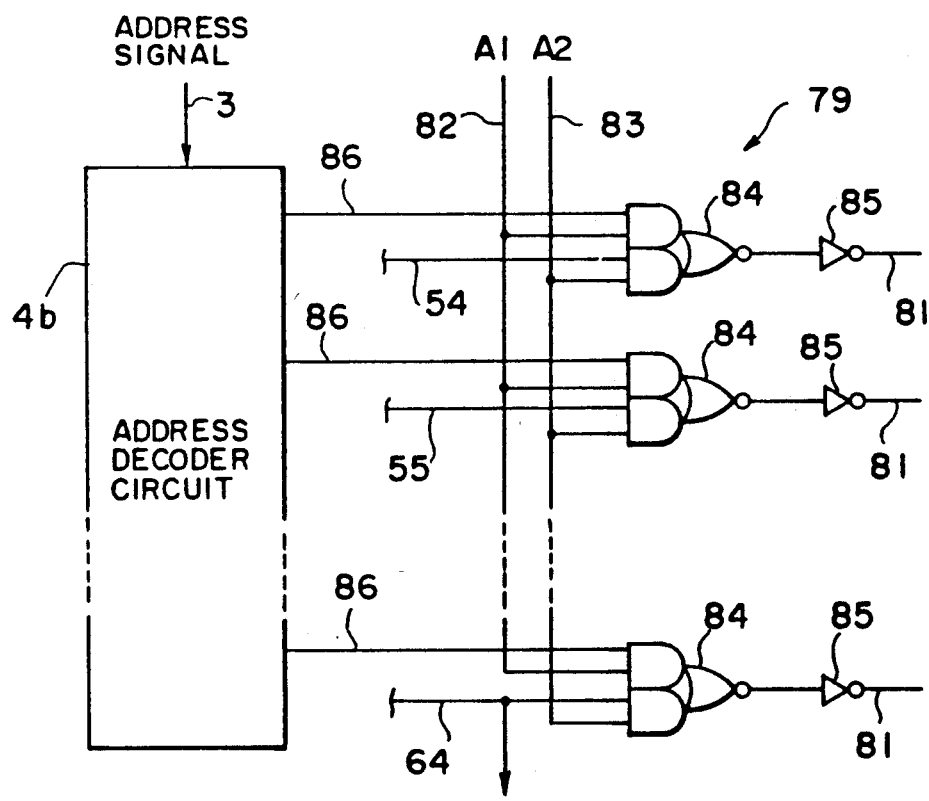
FIG. 11 shows the structure of a storage element selector circuit.

The register selector circuit 79 receives the output signals 54 and 55 and consistency/inconsistency signal 64 from the logical circuits 51 of the priority encoder circuit 10 and the address signal 3, and outputs a control signal 81 for controlling data input/output of the registers 78. The internal logical structure of the register selector circuit 79 is shown in FIG. 11. The address signal 3 is decoded by an address decoder circuit 4b, and outputs the decoded results 86. The decoded results have one signal of an H level corresponding to the inputted address signal, and the other signals of an L level. The signals 54 and 55 and consistency/inconsistency signal 64 outputted from the priority encoder circuit 10 also have one signal of an H level and the other signals of an L level. A circuit constructed of logical gates 84 and 85 determines the register to be accessed which register corresponds to the H level output signal from the address decoder circuit 4b. If control signals A1 and A2 supplied from signal lines 82 and 83, respectively, are (1, 0) (where "0" corresponds to an L level and "1" to an H level), there is outputted the control signal 81 for accessing the register 78 corresponding to the decoded results 86 by the address decoder circuit 4b. This state corresponds to the state where the registers 78 are used as a usual memory. If the control signals A1 and A2 are (0, 1), there is outputted the control signal 81 for accessing the register 78 in accordance with the output signals 54, 55 and 64 from the priority encoder circuit 10. This state corresponds to reading the associative operation results. The control signals A1 and A2 may be generated by using the address signal 3.

In the associative memory module 87 of the embodiment shown in FIG. 10, the registers 1, 2, and 78 can be used as a usual memory. In executing the associative function, first the storage key serving as the comparison operation results is set in the register 2, and control code information intended to be outputted as the associative operation results is set in the registers 78, respectively in the similar manner as a usual memory write operation. Thereafter, the search key serving as the comparison object is set in the register 1 in the similar manner as a usual memory write operation. As the associative operation results, either the code information 11 fixedly set or the control code information set in the register 78 is read by accessing a specific address in the similar manner as a usual memory read operation.

The associative memory module 87 according to the embodiments shown in FIGS. 1 and 10 may be used as a module in a single chip microcomputer or ASIC.

FIG. 12 shows a microcomputer according to the second invention. The structure shown in FIG. 12 is a system configured around CPU 88. CPU 88 is connected to peripheral circuits such as serial data I/O interface SCI 89, hard disc controller HDC 90, and cathode ray tube controller CRTC, and memories such as RAM 93 and ROM 92 via a data bus 96 and address bus 97. Data input/output from and to the external device of the chip is effected via a data buffer 94 and address buffer 95. The associative memory module 87 of this invention operates if the address signal 3 and data signal 13 are supplied, so that it can be readily accessed to the data bus 96 and address bus 97 in the similar manner as an usual memory. With this arrangement, the consistency/inconsistency signal 64 from the associative memory module 87 is not coupled to the data bus 96, but is directly coupled to CPU 88. Each time a comparison is conducted, CPU 88 reads the results (code information 11) of pattern consistency processing via the data bus 96 and thereafter executes necessary processing.

In the case where the pattern consistency processing is to be executed at high speed, the consistency/inconsistency signal 64 is positively used. The interconnection of the signal 64 to CPU 88 is shown in FIGS. 13 and 14.

Figure 13:
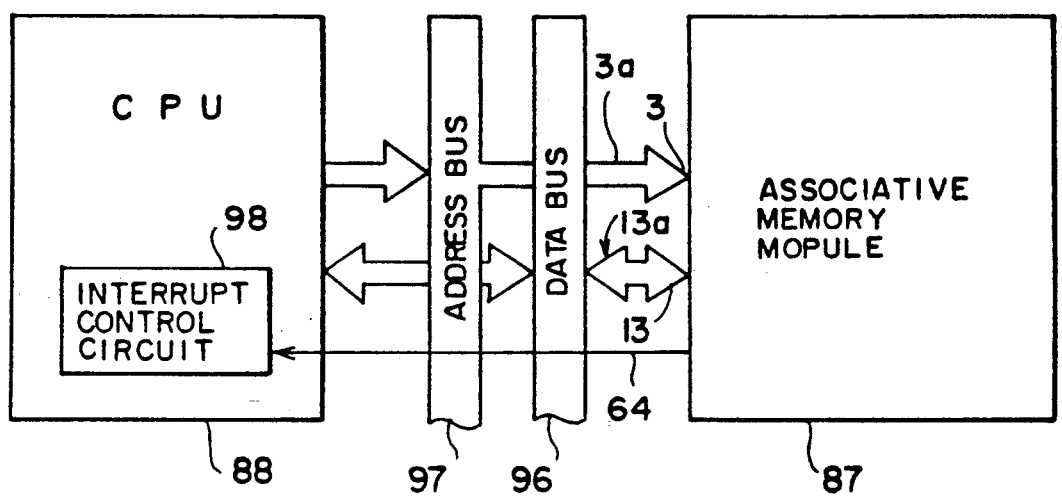

In the circuit arrangement shown in FIG. 13, the consistency/inconsistency signal 64 is inputted to an interrupt control circuit 98 of CPU 88. During the pattern consistency processing, the pattern comparison is repeated until a pattern consistency occurs. The processing after occurrence of a pattern consistency is performed by means of an interrupt process. With the structure shown in FIG. 12, patterns are compared at every time, the code information 11 representative of the associative operation results are read via the signal line 13a for the data signal 13 and the data bus 96, and the code information 11 is checked. This embodiment does not require such operations, resulting in high speed processing.

Figure 14:
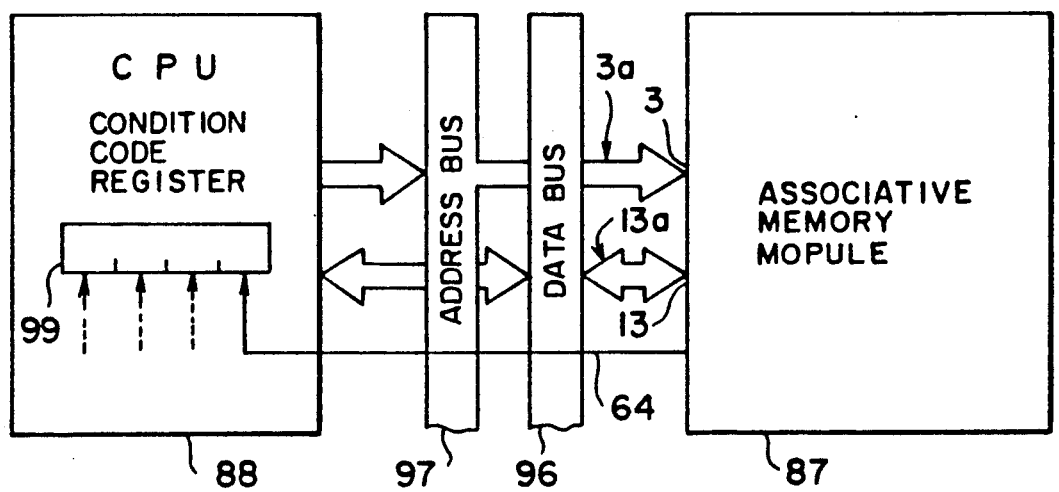

With the structure shown in FIG. 14, the consistency/inconsistency signal 64 is supplied to a condition code register 99 in CPU 88 as the branch condition for a conditional branch instruction. With this structure, when a pattern inconsistency occurs, it is possible to omit reading the code information 11 representative of the associative operation results via the data signal line 13a and data bus 96, resulting in high speed processing.

According to the present invention, the associative memory can be used as a usual memory so that the function utility field (range) can be made broad while efficiently using an LSI chip area.

Further, the associative memory can operate only with an address signal and data signal, so that designing specific peripheral circuits is not necessary and it can be easily built in a single chip microcomputer or the like as its peripheral module.

Furthermore, if suitable peripheral circuits are added to such CPU, there is presented an extended function to perform a pattern consistency processing at high speed.

What is claimed is:

1. A microcomputer constructed of a single chip comprising:
    a first storage element for storing data of a predetermined bit length;
    a plurality of second storage elements for storing data of said predetermined bit length;
    a first data bus connecting to said first storage element and said plurality of second storage elements so as to read and write said data of said predetermined bit length;
    a second data bus transferring said data of said predetermined bit length stored in said first storage element;
    a plurality of comparators coupled to said second storage elements and said second data bus for comparing said data of said predetermined bit length stored in said first storage element with said data of said predetermined bit length stored in said plurality of second storage elements;
    an output section connected to said plurality of comparators to receive the comparison results outputted from said plurality of comparators; and
    a selector section having a first terminal, a second terminal and a third terminal, said first terminal being connected to said first data bus, said second terminal being connected to an output line of said output section, and said third terminal being connected to a data signal line for inputting and outputting signals of the device, said selector section responsive to a predetermined state of a control signal for allowing a signal transmission between said first terminal and third terminal and inhibiting a signal transmission between said second terminal and third terminal, and responsive to a state of said control signal different from said predetermined state for inhibiting a signal transmission between said first terminal and third terminal and allowing a signal transmission between said second terminal and third terminal.

2. A microcomputer constructed of a single chip according to claim 1, wherein said data of said predetermined bit length is stored in said first storage element and said plurality of second storage elements via said third terminal and first terminal of said selector section and via said first data bus.

3. A microcomputer constructed of a single chip according to claim 2, wherein said data of said predetermined bit length stored in said first storage element is a search key, and said data of said predetermined bit length stored in said second storage elements is a storage key.

4. A microcomputer constructed of a single chip according to claim 1, including an address decoder for selecting at least one of said first storage element and said plurality of second storage elements in response to an address signal used for storing said search key and storage key in said first storage element and said plurality of second storage elements prior to an associative operation, and responsive to said associative operation results for supplying a control signal to said selector section so that code information in accordance with set associative operation results from said output section is transmitted from said second terminal to third terminal of said selector section.

* * * * *